(12) United States Patent
Heuer et al.

(10) Patent No.: US 6,212,052 B1
(45) Date of Patent: Apr. 3, 2001

(54) CONTACTLESS SAFETY SWITCH

(75) Inventors: Friedhelm Heuer, Oldendorf; Thomas Kuhlmann, Hiddenhausen, both of (DE)

(73) Assignee: K.A. Schmersal GmbH & Co. (DE)

( * ) Notice: Subject to any disclaimer, the term of this patent is extended or adjusted under 35 U.S.C. 154(b) by 0 days.

(21) Appl. No.: 09/388,683

(22) Filed: Sep. 2, 1999

(51) Int. Cl.$^7$ .................................................. H01H 36/00
(52) U.S. Cl. ............................................. 361/160; 361/179
(58) Field of Search .................................... 361/160, 144, 361/179, 180; 307/116

(56) References Cited

U.S. PATENT DOCUMENTS

| | | | |
|---|---|---|---|
| 4,618,823 | * 10/1986 | Dahlheimer et al. | 324/207 |
| 4,757,213 | * 7/1988 | Tigges et al. | 307/116 |
| 4,771,359 | * 9/1988 | Link | 361/179 |
| 5,254,879 | * 10/1993 | Jackson | 361/179 |
| 5,896,278 | * 4/1999 | Tamura et al. | 363/20 |
| 6,040,986 | * 3/2000 | Sakamoto et al. | 363/20 |

FOREIGN PATENT DOCUMENTS

3029543 * 2/1982 (DE) .

* cited by examiner

*Primary Examiner*—Stephen W. Jackson
*Assistant Examiner*—Rios Roberto
(74) *Attorney, Agent, or Firm*—Patterson, Thuente, Skaar & Christensne, P.A.

(57) ABSTRACT

The invention relates to a contactless safety switch for detecting the shut position of a shutting part in relation to a closeable part, with a switch unit, supplied with current by an electrical supply source on one of the parts and with a trip arranged on the other part and comprising a magnet. In this case, the switch unit comprises a transmission circuit with a clock-signal generator and with a transmission coil, a receiver circuit connected to an evaluation unit and having at least one receiver coil and also a Hall sensor responding to the magnet, and the trip comprises a trip coil which is capable, in the shut position, of being excited inductively by the transmission coil and exciting the receiver coil, while, in the shut position, the evaluation unit triggers a clearance path when the Hall sensor is activated via the magnet.

24 Claims, 3 Drawing Sheets

Fig. 3.

CONTACTLESS SAFETY SWITCH

TECHNICAL FIELD

The invention relates to safety switches as they are used in connection with a corresponding control device for surveying the open and closed positions of a door, a cover, a flap or the like of restricted areas containing revolving machines or other dangerous equipment or production areas to be protected against contamination so that the restricted area is only accessible in the case of no danger for operators or of no danger of contamination, respectively, and the machine or other equipment can only be started when all doors, covers, flaps or the like are closed. More specifically, the invention concerns contactless safety switches, safety switches without mechanical parts to be brought into engagement to actuate the safety switch.

BACKGROUND OF THE INVENTION

Safety switches or safety sensors serve for detecting the shut position of shutting parts, for example of doors or hinged covers, in relation to closeable parts, for example boundary walls, housing walls and the like provided with corresponding access orifices, and, for safety reasons, cooperate with a special actuator, so that their tripping position cannot be manipulated by means of simple tools or the like. Such safety switches comprise, in general, a switch unit and a trip, in each case one of these components being arranged on the closeable part and the other on the shutable part. In this context, safety switches with mechanical or magnetic, that is to say non-contact coupling between the switch unit and trip are known.

As regards mechanical coupling, exact alignment, along with low tolerances, are necessary, with the result that adjustment becomes more difficult. Since mechanical devices do not operate without contact, it is difficult to keep them free of germs, this being important, for example, for areas of use in the food sector.

Contactless safety switches based on interconnected Reed contacts are known. However, since Reed contacts weld together under relatively high currents or capacitive loads, the reliability of such safety switches is often inadequate, and, moreover, they require special evaluation units.

German Patent 4 112 064 discloses an alarm indicator arrangement with a switch unit which has a transmission circuit with an oscillator and with a transmission coil and a receiver circuit connected to a discriminator circuit and having at least one receiver coil. Here, continuous power transmission, even when signal transmission is taking place, is ensured. However, an arrangement of this kind does not always afford the required safety standard.

It is known from German Patent 3 029 543, in the field of signalling and monitoring technology, to use a primary unit in the form of a switch unit which possesses a transmission circuit with an oscillator and with a transmission coil and the receiver circuit connected to an evaluation unit and having at least one receiver coil and which cooperates with a secondary unit, a trip. The secondary unit comprises a receiver coil and a trip coil which is controlled by the transmission coil of the primary unit and which triggers an indicator signal in the shut position. In this case, a first frequency is transmitted from the primary unit to the secondary unit and a second frequency is transmitted in the reverse direction. However, an arrangement of this kind does not always afford the required safety standard, either.

German Laid-Open Patent Application 2 033 682 discloses a connecting device for electrical appliances, by means of which device a battery-powered appliance is brought into mutual bearing contact with a mains-powered appliance for signal or power transmission. Here, in each case a permanent magnet in one appliance closes a sealed-armature contact in the other appliance. A special coil with a U-shaped core is provided in each appliance for signal transmission and for power transmission in each case.

German Laid-Open Patent Application 4 113 665 discloses an external-field-safe contact arrangement of magnetically actuated switching elements for monitoring the shut state of windows and doors, a permanent magnet being mounted on a window wing or a door and at least two magnetic-field actuated switching elements being mounted on the window frame or door frame. The abovementioned problem of the welding together of contacts of the magnetically actuated switching elements arises here.

SUMMARY OF THE INVENTION

An object of the invention is to provide a contactless safety switch which has increased reliability.

Since, in a safety switch with a switch unit and with a trip comprising a magnet, according to the present invention the switch unit comprises a transmission circuit with a clock-signal generator and with a transmission coil, a receiver circuit connected to an evaluation unit and having at least one receiver coil and also a Hall sensor responding to the magnet, and the trip comprises a trip coil which, in the shut position, is capable of being inductively excited by the transmission coil and excites the receiver coil, whilst, in the shut position, the evaluation unit, after comparing the transmitted and received clock signals, triggers a clearance path when the Hall sensor is activated by the magnet, welding together at relatively high currents or capacitive loads cannot occur, so that reliability is increased.

Preferably, two signals can be fed to the evaluation unit in the shut position, the evaluation unit triggering the clearance path only when both signals are present. In this case, for the clearance of a shutting part in relation to a closeable part, it is necessary for two conditions to be satisfied. The presence of two signals in the evaluation unit is redundant, because feeding only one signal to the evaluation unit would not mean any loss of information regarding the approach of the trip. The redundant design further increases reliability in terms of the actuation of the safety switch.

Further objects, advantages and embodiments of the invention will become apparent from the following description and the accompanying drawings.

BRIEF DESCRIPTION OF THE DRAWINGS

FIG. 3 shows a schematic block diagram of a contactless safety switch of a third embodiment of the invention.

DESCRIPTION OF PREFERRED EMBODIMENTS

Figure 1:
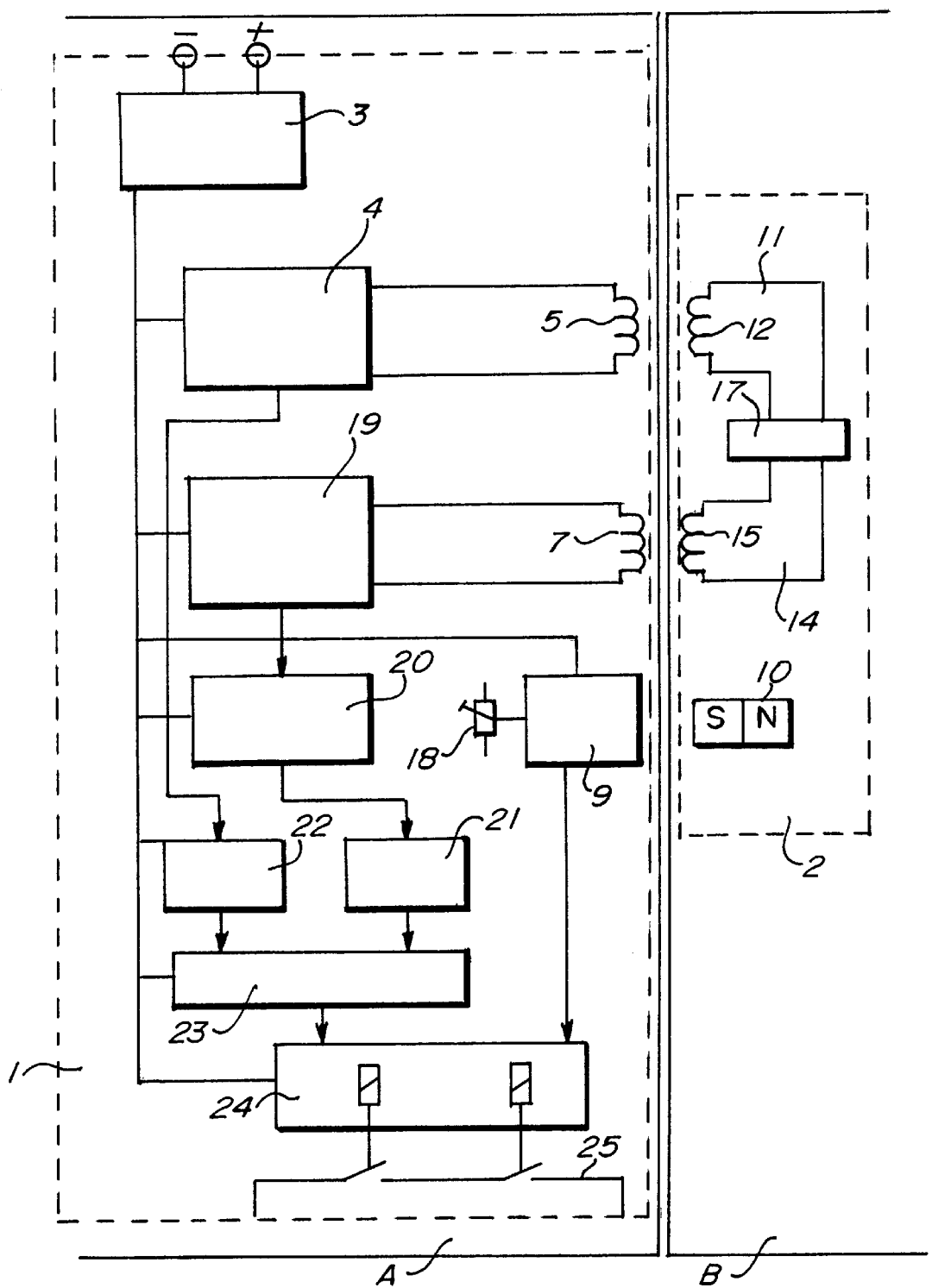
FIG. 1 shows a schematic block diagram of a contactless safety switch of a first embodiment of the invention.

According to FIG. 1, in a first embodiment of the invention a safety switch possesses a switch unit 1 (for example, a mains supply unit connected to a main supply), accommodated in a housing, and a trip 2, likewise accommodated in a housing, the said switch unit and the said trip being arranged in each case on a closable part A and a shutting part B. Preferably, the switch unit 1 is arranged on the closeable part A and the trip 2 on the shutting part B.

The switch unit 1 is supplied with current by an electrical supply source 3 and comprises a transmission circuit with a clock-signal generator 4 for generating a clock signal and also a transmission coil 5. The switch unit 1 comprises, furthermore, a receiver circuit with a receiver coil 7 and also a Hall sensor 9.

The trip 2 comprises a magnet 10 which, in the shut position, is arranged so as to be adjacent to the Hall sensor 9. The magnet 10 may be a permanent magnet. Furthermore, the trip 2 comprises a trip receiver circuit 11 with a trip coil 12 and also a trip transmission circuit 14 with a coil 15. The coils 12 and 15 are arranged in such a way that, in the shut position, they are essentially adjacent to the transmission coil 5 and to the receiver coil 7 respectively. The trip receiver circuit 11 can thus be inductively coupled to the transmission coil 5 of the transmission circuit via the trip coil 12, inductive coupling occurring as soon as the transmission coil 5 and trip coil 12 are adjacent to one another. The trip transmission circuit 14 is coupled to the trip receiver circuit 11 via a modifying circuit 17.

During the approach of the trip 2 to the switch unit 1, the Hall sensor 9 is activated when the magnetic field generated by the magnet 10 at the location of the Hall sensor 9 is sufficient to trigger the Hall sensor 9. Preferably, the Hall sensor 9 can be balanced via a trimming resistor 18, so that, by adjusting the switching threshold of the latter, that distance between the switch unit 1 and trip 2 at which the Hall sensor 9 is triggered can be fixed. Moreover, during the approach of the trip 2 to the switch unit 1, as a result of the inductive coupling with the trip receiver circuit 11 which then commences the transmission coil 5 induces in the latter a voltage which is modified by the modifying circuit 17. The modifying circuit 17 may comprise, in particular, a frequency divider which divides down the frequency of the clock signal by a predeterminable factor. The trip transmission circuit 14 thus transmits a modified clock signal if the trip receiver circuit 11 receives a clock signal from the transmission circuit. The trip transmission circuit 14, in turn, can be inductively coupled to the receiver coil 7 of the receiver circuit via the coil 15, inductive coupling occurring as soon as receiver coil 7 and coil 15 are adjacent to one another. During the approach of the trip 2 to the switch unit 1, the receiver coil 7 therefore receives the modified clock signal. The receiver coil 7 is excited at the frequency of the modified clock signal.

If appropriate, shields are mounted at the transmission coil 5 and receiver coil 7 and/or at the trip receiver circuit and trip transmission circuit 11, 14, so that undesirable coupling, for example between the trip transmission circuit 14 and transmission coil 5, is avoided. Alternatively, a correspondingly small clock signal may also be selected, or a sufficiently long distance is provided between the transmission coil 5 and receiver coil 7 or between the trip receiver circuit 11 and trip transmission circuit 14.

The receiver circuit also contains a bandpass filter 19. The bandpass filter 19 is designed in such a way that it lets through only the clock signal modified by the modifying circuit 17 and filters out other external signals. The said bandpass filter is connected, via an amplifier 20 for amplifying the modified clock signal, to a pulse-shaping and counting stage 21, in which the modified clock signal is conditioned and added on.

Moreover, the clock-signal generator 4 is connected directly to a further pulse-shaping and counting stage 22. The pulse-shaping and counting stage 22 thus receives the non-modified clock signal generated by the clock-signal generator 4. Connected to the outputs of the pulse-shaping and counting stages 21, 22 is a common comparator stage 23, the output of which is led to one channel of a relay stage 24. A further channel of the relay stage 24 is connected to the Hall sensor 9, a clearance signal being fed from the Hall sensor 9 to this channel when the Hall sensor is activated as a result of the approach of the magnet 10 belonging to the trip 2. The comparator stage 23 evaluates the counts received by the pulse-shaping and counting stage 21, 22, the comparator stage 23 being activated by the first arriving signal from the counter stage 22 and interrogating the pulse-shaping and counting stages 21, 22 after at least one suitable selected time interval or count.

If a frequency divider is used as the modifying circuit 17, the comparator stage 23 may be designed in such a way that it interrogates the counts of the pulse-shaping and counting stages 21, 22 after suitably selected different time intervals or counts, so that the pulse-shaping and counting stage 21, which receives the modified clock signal at a frequency lower by a specific factor than that of the clock signal generated by the clock-signal generator 4, is interrogated only after a timespan longer by the same factor or a count lower by the same factor than the pulse-shaping and counting stage 22. The comparator stage 23 transmits an output signal to the relay stage 24 only when the two counts received are in a predetermined ratio to one another.

Alternatively, the counts of the pulse-shaping and counting stages 21, 22 may also be interrogated simultaneously by the relay stage 24, in which case the comparator stage 23 is designed in such a way that it divides the counts of the pulse-shaping and counting stages 21, 22 by one another. The said comparator stage transmits an output signal to the relay stage 24 only when the quotient determined corresponds to the factor of the frequency divider. The pulse-shaping and counting stages 21, 22 may also be designed in such a way that the different frequency of the signal generated by the clock-signal generator 4 and modified is balanced again by means of different modulation. The comparator stage 23 then interrogates the count after equal, suitably selected timespans and transmits an output signal to the relay stage 24 only when the said counts are identical.

The relay stage 24 is interconnected with a clearance path 25. The relay stage 24 is preferably a safety relay stage which comprises two safety relays.

The clearance path 25 is enabled via the relay stage 24 only if the two channels of the relay stage 24 were previously inactive and a signal is subsequently present in each case at both channels of the relay stage 24. This presupposes both that the comparator stage 23 generates an output signal and that the Hall sensor 9 is activated. The safety switch consequently has a redundant design.

Figure 2:
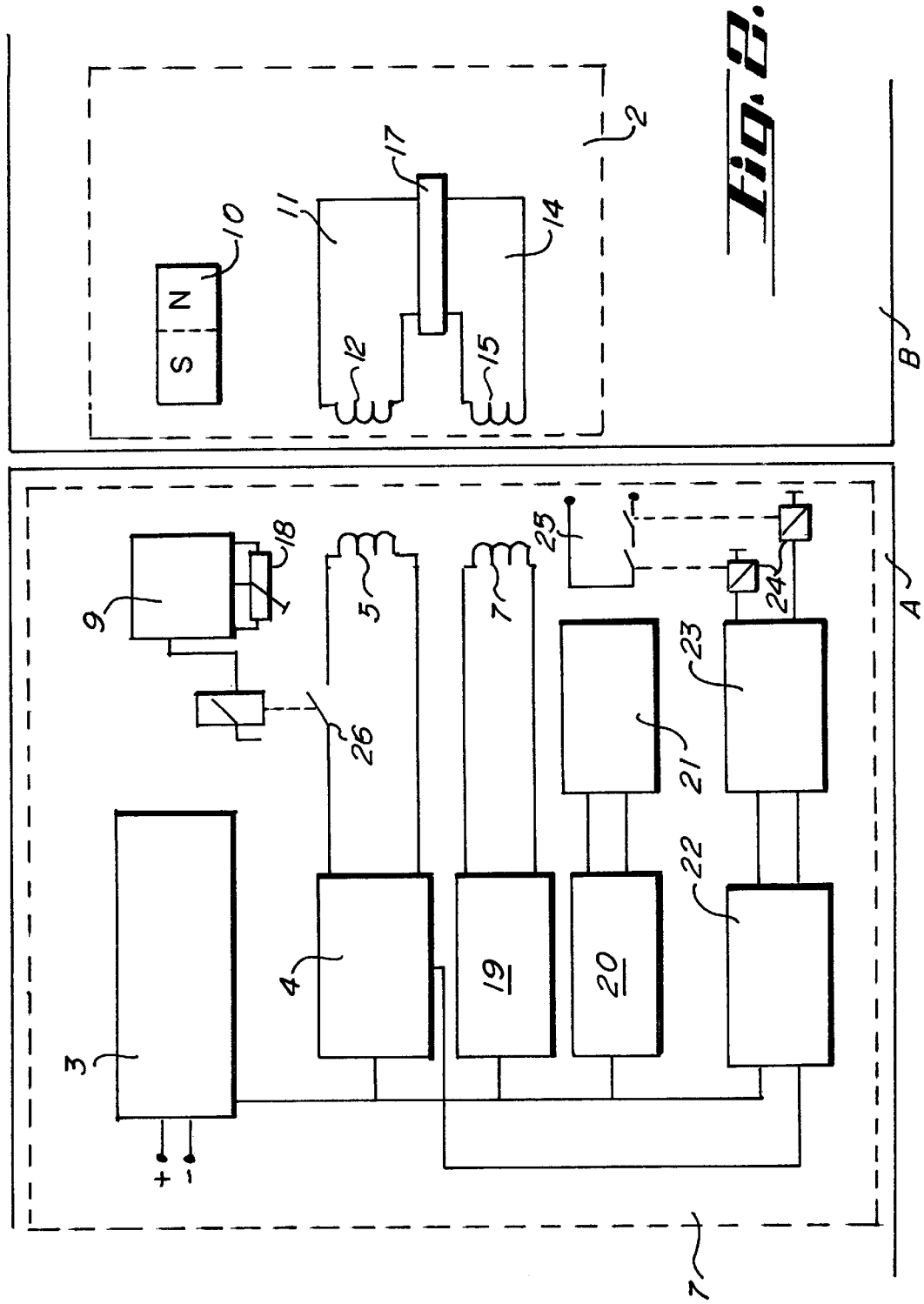
FIG. 2 shows a schematic block diagram of a contactless safety switch of a second embodiment of the invention.

According to FIG. 2, in a second embodiment of the invention the transmission circuit of the switch unit 1 comprises a switch 26 for closing and breaking the transmission circuit, said switch being capable of being switched on via the Hall sensor 9. During the approach of the trip 2 to the switch unit 1, the switch 26 is therefore switched on via the Hall sensor 9 when the magnetic field generated by the magnet 10 at the location of the Hall sensor 9 is sufficient for triggering the latter. Here, too, the Hall sensor 9 can preferably be balanced via a trimming resistor 18, so that it is possible, by adjusting the switching threshold of the latter, to fix that distance between the switch unit 1 and trip 2 at which the Hall sensor 9 is triggered. When the Hall sensor 9 is triggered, the switch 26 is switched on and the transmission circuit is consequently closed. Only then is the clock signal generated by the clock-signal generator 4 enabled, whereupon, in a similar way to the embodiment illustrated in FIG. 1, the transmission coil 5 induces a voltage in the trip receiver circuit 11 as a result of the inductive coupling with the latter.

The trip 2 and the evaluation unit of the safety switch are otherwise designed in exactly the same way as in the first embodiment of the invention. According to FIG. 2, however, in the second embodiment of the invention the clock signal generated by the clock-signal generator 4 is not fed continuously to the pulse-shaping and counting stage 22, but only in the event of clearance as a result of the activation of the Hall sensor 9. Inductive coupling between the transmission coil 5 and the transmission circuit and the trip coil 12 of the trip receiver circuit 11 likewise occurs only when transmission coil 5 and trip coil 12 are adjacent to one another and the transmission circuit is closed as a result of the activation of the Hall sensor 9 by the magnet 10. During the approach of the trip 2 to the switch unit 1 with transmission circuit closed, a clock signal modified by the modifying circuit 17 belonging to the trip 2 is fed to the pulse-shaping and counting stage 21 in a similar way to the first embodiment of the invention. The pulse-shaping and counting stages 21, 22 are connected to the common comparator stage 23, the output of which is connected to the relay stage 24, in a similar way to the first embodiment of the invention. The clearance path 25 interconnected with the relay stage 24 is enabled by the relay stage 24 only when the comparator stage 23 receives the enabled clock signal and the clock signal modified by the modifying circuit 17 in a predetermined frequency ratio. The feed of an enabled signal and of a modified signal is redundant, because the transmission of the enabled signal only would not mean any loss of information as regards the approach of the trip 2. In this embodiment, too, the redundant design thus results in increased reliability in terms of the actuation of the safety switch.

Figure 3:
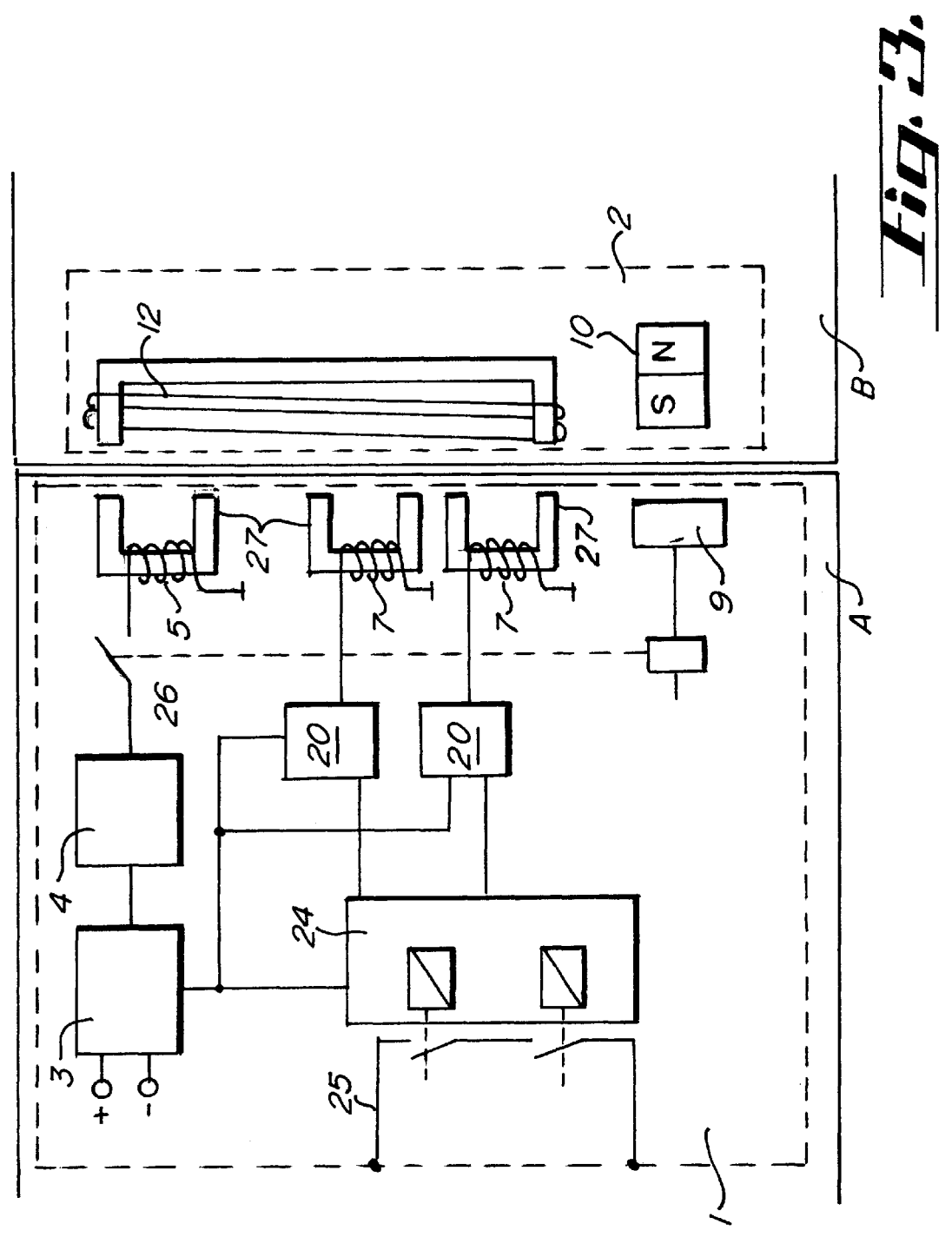

According to FIG. 3, in a third embodiment of the invention similar to the second embodiment, a switch 26 is likewise provided, which, when the Hall sensor 9 is triggered by the magnet 10, enables the clock signal generated by the clock-signal generator 4. In a similar way to the first two embodiments, the transmission circuit comprises a transmission coil 5 which, here, has a magnetizable U-shaped core 27. However, the receiver circuit comprises two receiver coils 7 which likewise each have a magnetizable U-shaped core 27 and which are each followed by an amplifier stage 20. The outputs of the amplifier stages 20 are in each case connected directly to a channel of the relay stage 24.

The trip 2 comprises, apart from the magnet 10 arranged so as to be adjacent to the Hall sensor 9 in the shut position, only the trip coil 12 which, in the shut position, is arranged so as to be adjacent to the transmission coil 5 and to the two receiver coils 7. The trip coil 12 likewise has a U-shaped magnetizable core 27.

In the shut state, therefore, inductive coupling occurs both between the transmission coil 5 and the trip coil 12 and between the trip coil 12 and the two receiver coils 7. When the clock signal generated by the clock-signal generator 4 is enabled, the transmission coil 5 therefore induces, in the trip coil 12, a voltage which in turn generates a voltage in the two receiver coils 7. The signal received by the receiver coils 7 is transmitted via the amplifier stage 20 to the two channels of the relay stage 24. The clearance path 25 interconnected with the relay stage 24 is enabled, in a similar way to the first two embodiments, only when a signal is present in each case at the two channels of the relay stage 24. In a similar way to the first two embodiments, the feed of two signals from the two receiver coils 7 to the relay stage 24 is redundant, because the transmission of only one signal would not mean any loss of information as regards the approach of the trip 2.

Although the invention has been described in some detail by way of illustration and example, for purposes of clarity and understanding, it will be obvious that certain changes and modifications may be practiced within the scope of the invention.

What is claimed is:

1. A contactless safety switch for detecting the shut position of a shutting part in relation to a closeable part, comprising:

a switch unit, supplied with current by an electrical supply source on one of said parts; and a trip arranged on the other part and comprising a magnet;

wherein said switch unit comprises a transmission circuit with a clock-signal generator and with a transmission coil;

wherein said switch unit further comprises a receiver circuit connected to an evaluation unit and having at least one receiver coil; and wherein said switch unit also comprises a Hall sensor responding to the magnet;

said trip comprising a trip coil which, in the shut position, is capable of being excited inductively by a transmission coil and exciting the receiver coil, whilst, in the shut position, the evaluation unit, after comparing the transmitted and received clock signals, triggers a clearance path when the Hall sensor is activated via the magnet.

2. The safety switch according to claim 1, wherein in the shut position, two signals are capable of being fed to the evaluation unit which triggers the clearance path only when the two signals are present in the evaluation unit.

3. The safety switch according to claim 1, wherein the evaluation unit is followed by an, in particular, two-channel relay stage, via which the clearance path can be enabled.

4. The safety switch according to claim 1, wherein two receiver coils are provided, which is capable of being coupled inductively to the trip coil, the clearance path being capable of being enabled only when a signal is delivered in each case by the two receiver coils and no signal was present beforehand.

5. The safety switch according to claim 1, wherein a switch capable of being actuated via the Hall sensor is provided in the transmission circuit, the clock signal generated by the clock-signal generator being capable of being enabled via the Hall sensor to the receiver coil.

6. The safety switch according to claim 1, wherein the transmission circuit is connected to the evaluation unit.

7. The safety switch according to one of claim 1, wherein the receiver coil is capable to be inductively coupled to the trip coil indirectly, the trip comprising a trip receiver circuit—comprising the trip coil—and a trip transmission circuit coupled to the said trip receiver circuit and capable of being coupled inductively to the receiver coil.

8. The safety switch according to claim 7, wherein the trip transmission circuit is coupled to the trip receiver circuit via a modifying circuit, in such a way that the trip transmission circuit transmits a modified clock signal.

9. The safety switch according to claim 8, wherein the clock signal generated by the clock-signal generator and the modified clock signal received by the receiver circuit is capable of being fed to the evaluation unit which triggers the clearance path when the two clock signals are in a predetermined frequency ratio.

10. The safety switch according to claim 8, wherein the evaluation unit comprises two parallel-connected pulse-shaping and counting stages, of which one is designed for conditioning and adding the clock signal generated by the clock-signal generator and one is designed for conditioning and adding the modified clock signal.

11. The safety switch according to claim 10, wherein the evaluation unit comprises a comparator stage which follows the pulse-shaping and counting stages and which transmits an output signal only when the counts of the pulse-shaping and counting stages are in a predetermined frequency ratio.

12. The safety switch according to claim 11, wherein a signal capable of being enabled via the Hall sensor is capable of being fed to the relay stage via one channel and the output signal of the comparator stage is capable of being fed to the relay stage via another channel, the clearance path being capable of being enabled by the relay stage only when a signal is present at the two channels and no signal was present beforehand at the two channels.

13. The safety switch according to claim 5, wherein the clock signal which is generated by the clock-signal generator and which is capable of being enabled via the Hall sensor is capable of being fed to the relay stage via one input and the modified clock signal received by the receiver circuit is capable of being fed to the relay stage via another channel, the clearance path being capable of being enabled by the relay stage only when a signal is present in each case at the two channels and no signal was present beforehand at the two channels.

14. The safety switch according to claim 11, wherein the comparator stage is capable of interrogating the counts of the pulse-shaping and counting stages in each case after a suitably selected constant time interval.

15. The safety switch according to claim 14, wherein the comparator stage is capable of transmitting an output signal to the relay stage only when the counts of the pulse-shaping and counting stages differ from one another by a predetermined value.

16. The safety switch according to claim 8, wherein the modifying circuit is a frequency divider which divides down a clock signal received from the trip receiver circuit by a predetermined factor.

17. The safety switch according to claim 16, wherein the pulse-shaping and counting stage is interrogated only after a time interval longer than that of the pulse-shaping and counting stage by the factor of the modifying circuit and the comparator stage transmits an output signal to the relay stage only when the two counts received are identical.

18. The safety switch according to claim 16, wherein the pulse-shaping and counting stages are capable of balancing the different frequency of the generated clock signal and modified clock signal by means of different modulation.

19. The safety switch according to claim 8, wherein the modifying circuit is designed in such a way that the frequency difference between the clock signal generated by the clock-signal generator and the modified clock signal is large in relation to the frequency of the clock signal generated by the clock-signal generator.

20. The safety switch according to claim 1, wherein the receiver coil is followed by a bandpass filter which lets through only the, if appropriate, modified clock signal.

21. The safety switch according to claim 1, wherein the evaluation unit is preceded by at least one amplifier.

22. The safety switch according to claim 1, wherein the Hall sensor is capable of being balanced.

23. The safety switch according to claim 1, wherein the magnet is a permanent magnet.

24. The safety switch according to claim 1, wherein the switch unit is arranged on the closeable part and the trip on the shutting part.

* * * * *